(12) United States Patent
Kikuchi et al.

(10) Patent No.: US 10,754,086 B2
(45) Date of Patent: Aug. 25, 2020

(54) DISPLAY DEVICE WITH LIGHT SOURCE CONTROL

(71) Applicant: SHARP KABUSHIKI KAISHA, Sakai, Osaka (JP)

(72) Inventors: Katsutoshi Kikuchi, Sakai (JP); Hiromi Enomoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/339,649

(22) PCT Filed: Oct. 2, 2017

(86) PCT No.: PCT/JP2017/035822
§ 371 (c)(1),
(2) Date: Apr. 4, 2019

(87) PCT Pub. No.: WO2018/066513
PCT Pub. Date: Apr. 12, 2018

(65) Prior Publication Data
US 2019/0243058 A1    Aug. 8, 2019

(30) Foreign Application Priority Data

Oct. 7, 2016    (JP) .................................. 2016-198910

(51) Int. Cl.
*G09G 3/34*  (2006.01)
*F21V 8/00*  (2006.01)
(Continued)

(52) U.S. Cl.
CPC .............. *G02B 6/0083* (2013.01); *F21S 2/00* (2013.01); *G02B 6/0068* (2013.01);
(Continued)

(58) Field of Classification Search
CPC .. G02B 6/0083; G02B 6/0068; G02B 6/0091; G09G 3/342; G09G 3/3648;
(Continued)

(56) References Cited

U.S. PATENT DOCUMENTS

2015/0187295 A1    7/2015  Sakamaki et al.
2017/0263209 A1*   9/2017  Ding ........................ G09G 5/10

FOREIGN PATENT DOCUMENTS

JP    2009-229922 A    10/2009
JP    2014-149938 A    8/2014
(Continued)

*Primary Examiner* — Lisa S Landis
(74) *Attorney, Agent, or Firm* — ScienBiziP, P.C.

(57) ABSTRACT

A liquid crystal display device includes a liquid crystal panel, a backlight device at least including LEDs arrayed at intervals and LED wiring portions connected to the LEDs such that the LEDs adjacent to one another have different connection targets, an image signal generation unit that generates an image signal related to the image, a panel control unit that displays the image on the liquid crystal panel based on the image signal generated in the image signal generation unit, and an LED control unit that energizes a relatively great amount of the LED wiring portions when the image based on the image signal sent from the image signal generation unit is a normal image, and selectively energizes a relatively small amount of the LED wiring portions when the image is a small image of which a display range is smaller than a display range of the normal image.

4 Claims, 11 Drawing Sheets

(51) Int. Cl.
*H05K 1/18* (2006.01)
*G09G 3/36* (2006.01)
*F21S 2/00* (2016.01)
*G02F 1/133* (2006.01)

(52) U.S. Cl.
CPC .......... *G02B 6/0091* (2013.01); *G02F 1/133* (2013.01); *G09G 3/342* (2013.01); *G09G 3/3648* (2013.01); *H05K 1/181* (2013.01); *G09G 2320/0271* (2013.01); *G09G 2320/0626* (2013.01); *G09G 2330/023* (2013.01); *H05K 2201/09027* (2013.01); *H05K 2201/10106* (2013.01); *H05K 2201/10522* (2013.01)

(58) Field of Classification Search
CPC ... G09G 2320/0271; G09G 2320/0626; G09G 2330/023; H05K 1/181; H05K 2201/09027; H05K 2201/10106; H05K 2201/10522
See application file for complete search history.

(56) References Cited

FOREIGN PATENT DOCUMENTS

| JP | 2014149938 | * | 8/2014 |
|----|------------|---|--------|
| JP | 2015-096872 A | | 5/2015 |
| JP | 2015-125245 A | | 7/2015 |

* cited by examiner

DISPLAY DEVICE WITH LIGHT SOURCE CONTROL

TECHNICAL FIELD

The present invention relates to a display device.

BACKGROUND ART

As an example of a conventional liquid crystal display device, one described in the following Patent Document 1 is known. In the liquid crystal display device described in Patent Document 1, when a low power consumption display mode is selected, only four central LED light sources turn on among all LED light sources formed on an LED board, and other LED light sources turn off. Then, among regions on a light emitting surface provided in an LED backlight unit, on a display region of a liquid crystal display panel, which overlaps a turned-on region (light emitting region) in plan view, the liquid crystal display device displays an image in a predetermined manner.

RELATED ART DOCUMENT

Patent Document

Patent Document 1: Japanese Unexamined Patent Application Publication No. 2015-96872

Problem to be Solved by the Invention

In the liquid crystal display device described in Patent Document 1 described above, the LED light sources which overlap the image displayed on the liquid crystal display panel in plan view are selectively turned on, and the LED light sources which do not overlap the image in plan view are not turned on. In the image displayed on this liquid crystal display panel, a display range and display position thereof in the surface of the liquid crystal display panel can vary, and accordingly, every time in response to this, it is necessary to change the number and positions of the LED light sources to be turned on. Accordingly, a circuit configuration for energizing the LED light sources and a control related to the LED light sources have been complicated.

DISCLOSURE OF THE PRESENT INVENTION

The present invention has been completed on the basis of such circumferences as described above. It is an object of the present invention to simplify the circuit configuration and control of the light sources while reducing the power consumption.

Means for Solving the Problem

A display device of the present invention includes: a display panel that displays an image; a lighting device that supplies light to the display panel for displaying, the lighting device at least including light sources arrayed at intervals and light source wiring portions connected to the light sources such that the light sources adjacent to one another have different connection targets; an image signal generation unit that generates an image signal related to the image; a panel control unit that displays the image on the display panel based on the image signal generated in the image signal generation unit; and a light source control unit that energizes a relatively great amount of the light source wiring portions when the image based on the image signal sent from the image signal generation unit is a normal image, and selectively energizes a relatively small amount of the light source wiring portions when the image is a small image of which a display range is smaller than a display range of the normal image.

In this way, when the image signal generated in the image signal generation unit is input to the panel control unit, the panel control unit displays the image on the display panel on the basis of the image signal. The light source control unit controls the light sources on the basis of the image signal sent from the image signal generation unit. Herein, when the image based on the image signal is a normal image, then in comparison with the case of a small image to be described next, the light source control unit energizes relatively many of the light source wiring portions connected to the light sources such that the light sources adjacent to another have different connection targets. Accordingly, light sources connected to these light source wiring portions turn on, and by using light thereof, the normal image is displayed on the display panel. Meanwhile, when the image based on the image signal is the small image of which a display range is smaller than that of the normal image, the light source control unit selectively energizes relatively few of the light source wiring portions. Accordingly, the light sources connected to specific energized light source wiring portions turn on, and by using light thereof, the small image is displayed on the display panel. The light source wiring portions energized at this time are connected to the light sources such that the light sources adjacent to one another have different connection targets. Accordingly, the light can be applied to a wide range of the display panel, whereby display of the small image can be good even if a display range and a display position of the small image in the surface of the display panel vary. As described above, only when the small image is displayed, the specific light source wiring portion is selectively energized, and accordingly, the power consumption can be reduced. In addition, in comparison with the conventional case of adjusting the number and positions of the light sources, which are to be turned on, in response to the display range and display position of the image to be displayed, a circuit configuration and control of the light sources are simplified.

The following configurations are preferable as aspects of the present invention.

(1) The lighting device may at least include a light guide plate having a plate shape in which one of outer peripheral end surfaces is formed as a light incident end surface that faces the light sources and on which light is incident and either one of plate surfaces is a light exit plate surface through which light exits, and the light sources are arranged to be arrayed along the light incident end surface, and the image signal generation unit may generate the image signal related to the small image such that the small image is disposed in a form of being biased to an end surface opposite to the light incident end surface in a surface of the light emitting plate surface in the light guide plate. As described above, in the lighting device of a so-called one-side light-incident type in which one of the outer peripheral end surfaces of the light guide plate is the light incident end surface, when light is incident on the light incident end surface from the light sources arrayed along the light incident end surface, then as tendency, unevenness in luminance is prone to be visually recognized on the portion of the light emitting plate surface of the light guide plate, the portion being close to the light incident end surface. In contrast, the small image displayed on the display panel by the panel control unit on the basis of the image signal related to the small image and generated by the image signal generation unit is disposed in a form of being biased to an end surface opposite to the light incident end surface in the surface of the light emitting plate surface in the light guide plate. Accordingly, the small image becomes less likely to be affected by the unevenness in luminance, which can occur in such a portion of the light emitting plate surface as described above, the portion being close to the light incident end surface. In this way, display quality at the time of displaying the small image on the display panel becomes excellent.

(2) The lighting device may at least include a light guide plate having a plate shape in which one of outer peripheral end surfaces is formed as a light incident end surface that faces the light sources and on which light is incident and either one of plate surfaces is a light exit plate surface through which light exits, and the light sources are arranged to be arrayed along the light incident end surface, and the light source wiring portions may be constituted such that the light sources located on an end of the light incident end surface are not connected to the light source wiring portions selectively energized by the light source control unit when the image is the small image. Among the light sources arrayed along the light incident end surface, with regard to the light sources located on the end of the light incident end surface, light thereof emitted following the turning on is less likely to effectively incident on the light incident end surface than that of the light sources located on the center side with respect to the light sources located on the end. Meanwhile, when the number of light sources connected to the light source wiring portion selectively energized by the light source control unit when the image is the small image is limited. Accordingly, a quantity of light supplied to the display panel at the time of displaying the small image is apt to be insufficient. In this regard, to the light source wiring portion selectively energized by the light source control unit when the image is the small image, the light sources located on the end of the light incident end surface are not connected. Accordingly, the light emitted from the light sources connected to the light source wiring portion at the time of displaying the small image is made easy to effectively incident on the light incident end surface. In this way, the quantity of light supplied to the display panel becomes sufficient, and display quality of the displayed small image is improved.

(3) The lighting device may at least include a light guide plate having a plate shape in which one of outer peripheral end surfaces is formed as a light incident end surface that faces the light sources and on which light is incident and either one of place surfaces is a light exit plate surface through which light exits, and the light sources are arranged to be arrayed along the light incident end surface, and among the light source wiring portions, the light source wiring portion selectively energized by the light source control unit when the image is the small image may be connected to the light sources dispersed from one end of the light incident end surface to another end of the light incident end surface. In this way, the light source wiring portion energized at the time when the small image is displayed is connected to the light sources dispersed from one end of the light incident end surface to the other end thereof. Accordingly, light can be applied to a wider range of the display panel. In this way, even if the display range and the display position of the small image in the surface of the display panel vary, the display of the small image is improved more.

(4) The display panel may at least include red pixel portions that exhibit red, green pixel portions that exhibit green, and blue pixel portions that exhibit blue, and the image signal generation unit may generate the image signal such that the number of gradations of the small image is smaller than the number of gradations of the normal image. In this way, on the display panel, color display with a predetermined gradation is performed by the red pixel portions, the green pixel portions, and the blue pixel portions. At the time of displaying the small image on the display panel, the number of gradations of the small image is smaller than that of the normal image. Accordingly, power related to the drive of the display panel can be reduced, whereby the power consumption can be further reduced.

Advantageous Effect of the Invention

In accordance with the present invention, the circuit configuration and control of the light sources can be simplified while reducing the power consumption.

MODES FOR CARRYING OUT THE INVENTION

First Embodiment

A first embodiment of the present invention will be described with reference to FIG. 1 to FIG. 11. In the present embodiment, a liquid crystal display device 10 is illustrated as an example. Note that an X-axis, a Y-axis, and a Z-axis are illustrated in a part of each drawing, and each drawing is drawn such that directions of the respective axes are directions illustrated therein. Moreover, an upper side of FIG. 2 is a front side, and a lower side thereof is a back side.

Figure 1:
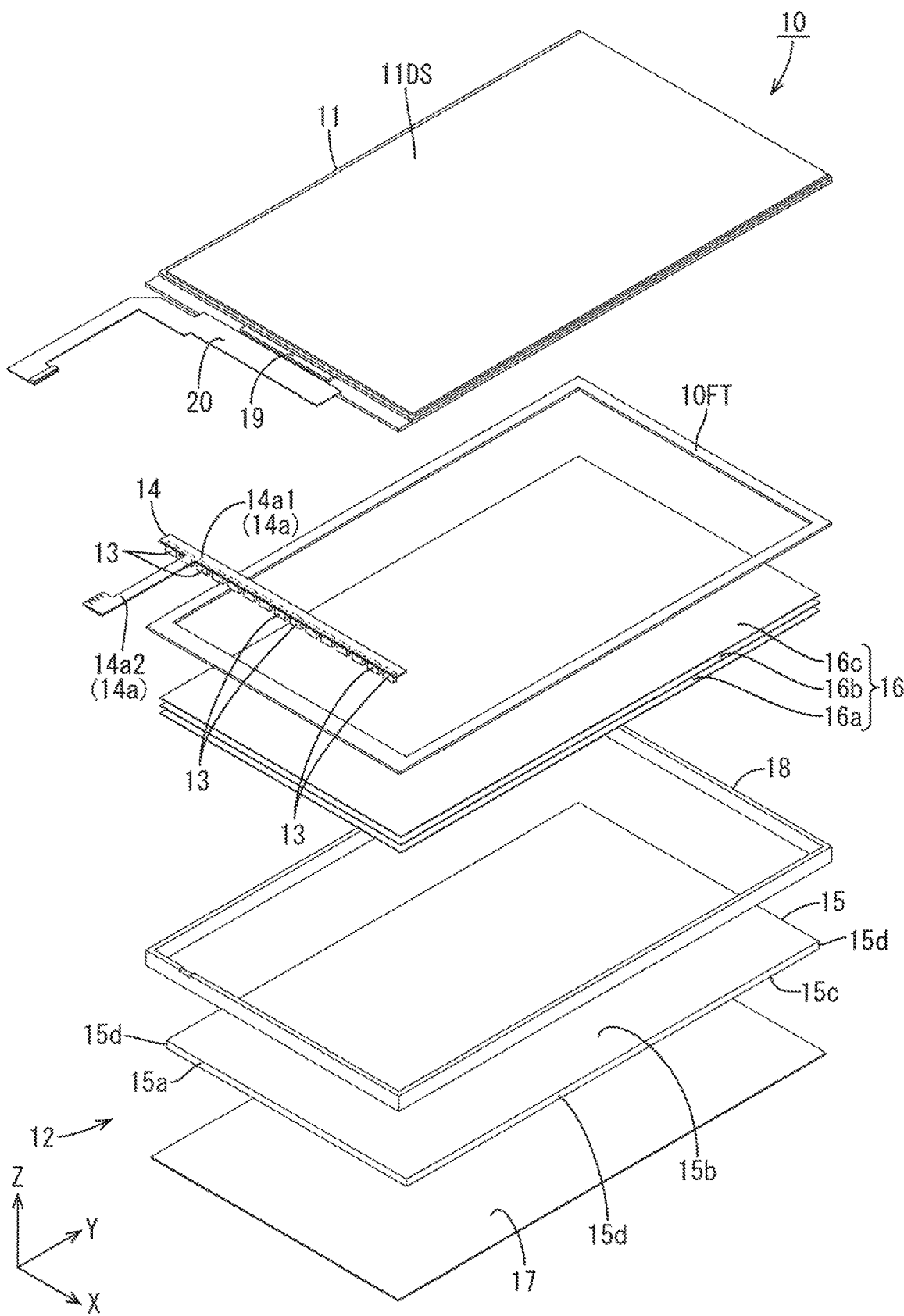
FIG. 1 is an exploded perspective view of a liquid crystal display device according to a first embodiment of the present invention.

As illustrated in FIG. 1, the liquid crystal display device 10 has a longitudinally long rectangular shape as a whole. The liquid crystal display device 10 at least includes: a liquid crystal panel (a display panel) 11 having a display surface 11DS configured to display an image; a backlight device (a lighting device) 12 as an external light source that is disposed on the back side with respect to the liquid crystal panel 11 and applies light for the display to the liquid crystal panel 11; and a fixing tape 10FT for fixing the liquid crystal panel 11 and the backlight device 12. Among them, the fixing tape 10FT has a laterally long frame shape that follows a picture frame shape (a non-display region of the liquid crystal panel 11) of the liquid crystal display device 10, and preferably, for example, is made of a light-shielding double-sided adhesive tape made by applying an adhesive on both surfaces of a base material having light shielding properties. The liquid crystal display device 10 according to the present embodiment is used for a portable information terminal such as a smartphone. Therefore, a screen size of the liquid crystal panel 11 that constitutes the liquid crystal display device 10 is generally set to a size classified as a small size (for example, several inches).

Figure 2:
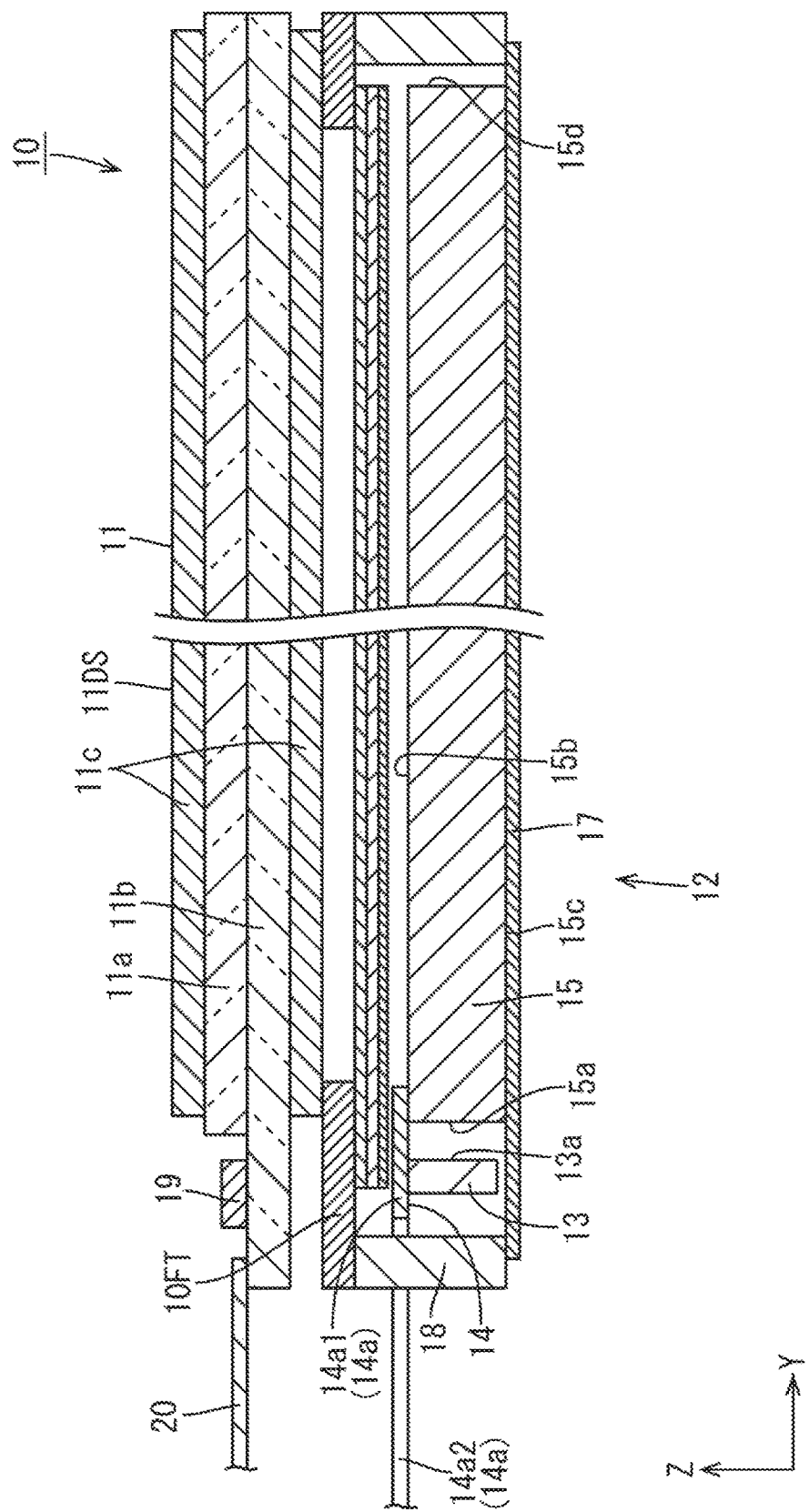
FIG. 2 is a cross-sectional view illustrating the liquid crystal display device cut along a longitudinal direction thereof.

As illustrated in FIG. 2, the liquid crystal panel 11 has a configuration in which a pair of substantially transparent glass-made substrates 11a and 11b are pasted to each other with a predetermined gap interposed therebetween and liquid crystal is sealed between the substrates 11a and 11b. Between the pair of substrates 11a and 11b, on such an array substrate (an active matrix substrate) 11b disposed on the back side, there are provided; switching elements (for example, TFTs) connected to a source line and a gate line perpendicular to each other; pixel electrodes connected to the switching elements, an orientation film; and the like. Moreover, this liquid crystal panel 11 includes: a display portion (an active area) on which an image is displayed; and a non-display portion (a non-active area that forms a picture frame shape (a frame shape) that surrounds the display portion and does not allow an image to be displayed thereon. Note that a front and back pair of polarizing plates 11c are individually pasted on outer surfaces of the pair of substrates 11a and 11b.

Figure 3:
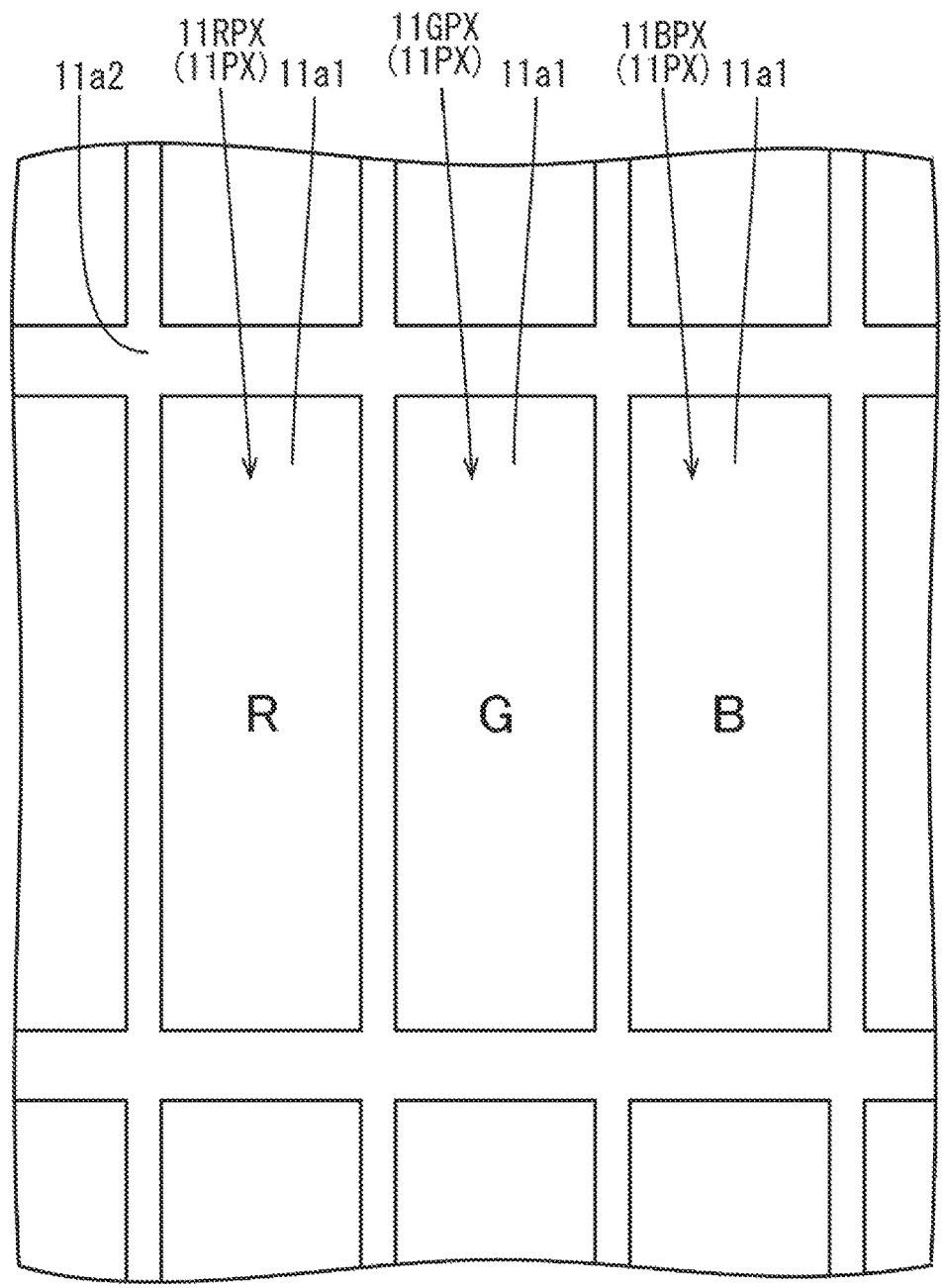
FIG. 3 is a plan view of a display region in a CF substrate of a liquid crystal panel provided in the liquid crystal display device.

Meanwhile, as illustrated in FIG. 3, on the CF substrate (a counter substrate) 11a disposed on the front side, there are provided color filters 11a1 in which colored portions of colors red (R), green (G) and blue (B) are arranged in a predetermined arrangement; and a light shielding portion (a black matrix) 11a2 that partitions the colored portions adjacent to one another; and in addition, counter electrodes; an orientation film; and the like. The respective colored portions which constitute the color filters 11a1 in the CF substrate 11a and the pixel electrodes in the array substrate 11b are disposed to face each other, and constitute pixel portions 11PX. The pixel portions 11PX include three-color pixel portions which are: red pixel portions 11RPX which exhibit red; green pixel portions 11GPX which exhibit green; and blue pixel portions 11BPX which exhibit blue. These are arranged to be repeatedly arrayed along the X-axis direction in a predetermined order. In this liquid crystal panel 11, display pixels configured to color-display with a predetermined gradation are composed of the three-color (R, G, B) pixel portions 11RPX, 11GPX and 11BPX adjacent to one another along the X-axis direction. The three-color pixel portions 11RPX, 11GPX, and 11BPX which constitute the display pixels are arranged to be repeatedly arrayed along the X-axis direction (a row direction) on the display surface 11DS of the liquid crystal panel 11, thereby constituting a display pixel group. A large number of the display pixel groups are arranged to be arrayed along the Y-axis direction (a column direction).

As illustrated in FIG. 1 and FIG. 2, on the array substrate 11b in the liquid crystal panel 11, there are individually mounted: a driver (panel driving component) 19 that drives the liquid crystal panel 11; and a flexible board (connecting component) 20 that electrically connects the liquid crystal panel 11 and an external panel control board (not illustrated). Between these, the driver 19 is subjected to chip on glass (COG) mounting on the array substrate 11b. The driver 19 is composed of an LSI chip having a drive circuit therein, and operates on the basis of a signal supplied from the panel control board that is a signal supply source. In this way, the driver 19 processes such an input signal supplied from the panel control board to generate an output signal, and outputs the output signal to a display region of the array substrate 11b. The flexible board 20 includes a base material made of a synthetic resin material (for example, a polyimide-based resin or the like) having insulation properties and flexibility, and has a large number of wiring patterns (not illustrated) on the base material. The flexible board 20 is bent so as to be turned back in the liquid crystal display device 10, one end thereof in a longitudinal direction is connected to the panel control board, and another end thereof in the longitudinal direction is connected to the array substrate 11b of the liquid crystal panel 11.

Next, the backlight device 12 will be described. As illustrated in FIG. 1, the backlight device 12 at least includes: light emitting diodes (LEDs) 13 as light sources; an LED board (light source board) 14 on which the LEDs 13 are mounted; a light guide plate 15 that guides light sent from the LEDs 13; an optical sheet (an optical member) 16 laminated and disposed on a front side of the light guide plate 15; reflective sheet (reflective member) laminated and disposed on a back side of the light guide plate 15; and a frame 18 that has a frame shape and surrounds the LEDs 13, the light guide plate 15, the optical sheet 16 and the like. In this backlight device 12, on one end between a pair of ends on long sides thereof, the LED board 14 is disposed, and the respective LEDs 13 mounted on the LED board 14 are biased to one end on a long side in the liquid crystal panel 11. As described above, the backlight device 12 according to the present embodiment is constituted as a one-side light-incident edge light type (side light type) in which light of the LEDs 13 is incident on the light guide plate 15 from only one side thereof. Subsequently, the respective constituent components of the backlight device 12 will be described in detail.

As illustrated in FIG. 1 and FIG. 2, the LEDs 13 are configured such that LED chips are sealed by a sealing material on a board fixed to the LED board 14. Each of the LEDs 13 includes an anode terminal and a cathode terminal, which are not illustrated, and the LED chip is caused to emit light in such a manner that a forward-biased direct current is flown therebetween. In the LED 13, for example, the LED chip is defined to emit blue light as monochromatic light, and phosphors (a yellow phosphor, a green phosphor, a red phosphor and the like) are dispersed and blended in the sealing material, whereby the LED 13 emits white light as a whole. The LED 13 is of a so-called side surface emission type in which a surface adjacent to a surface where the LED 13 is mounted on the LED board 14 serves as a light emitting surface 13a.

Figure 4:
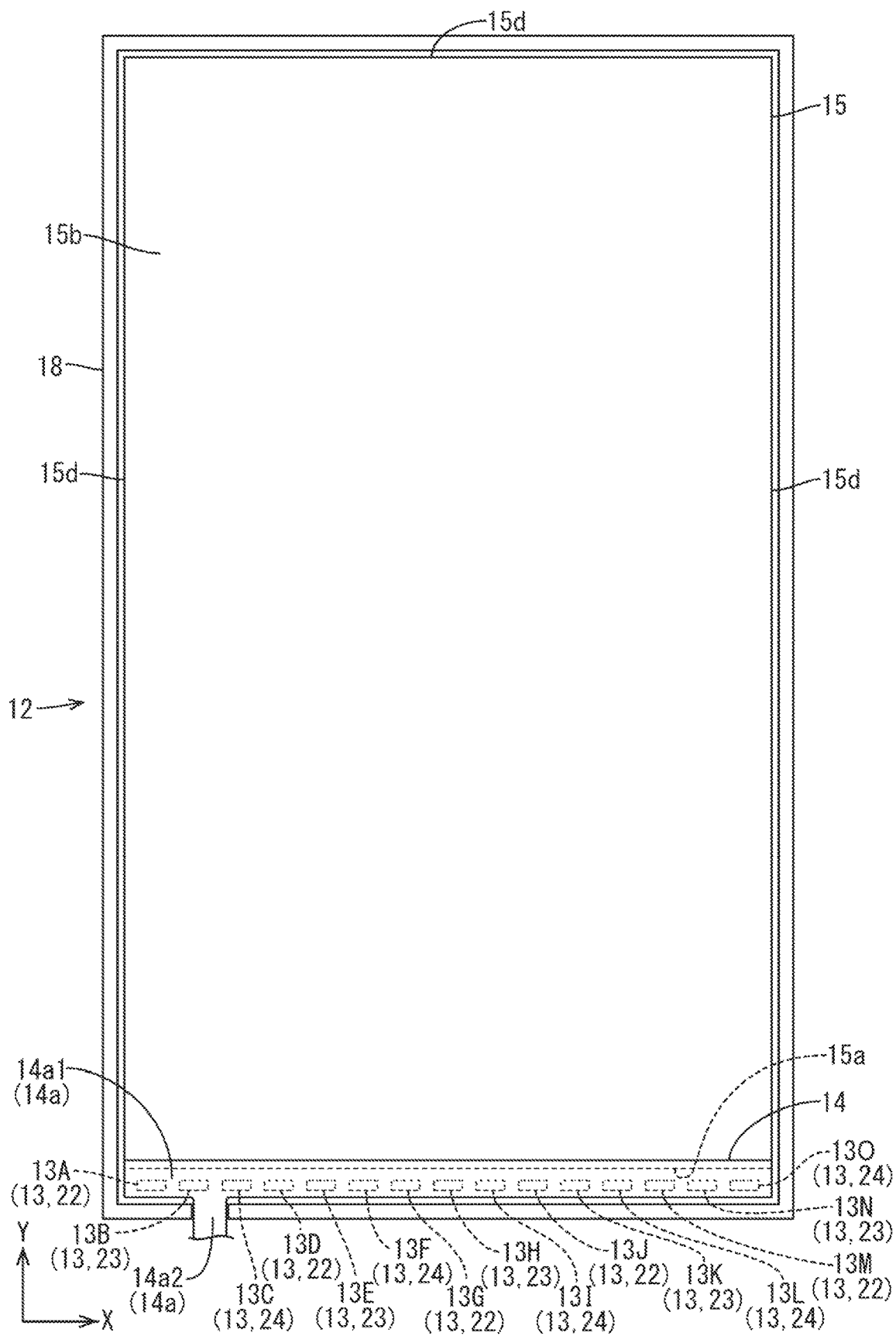
FIG. 4 is a plan view of a backlight device provided in the liquid crystal display device.
Figure 5:
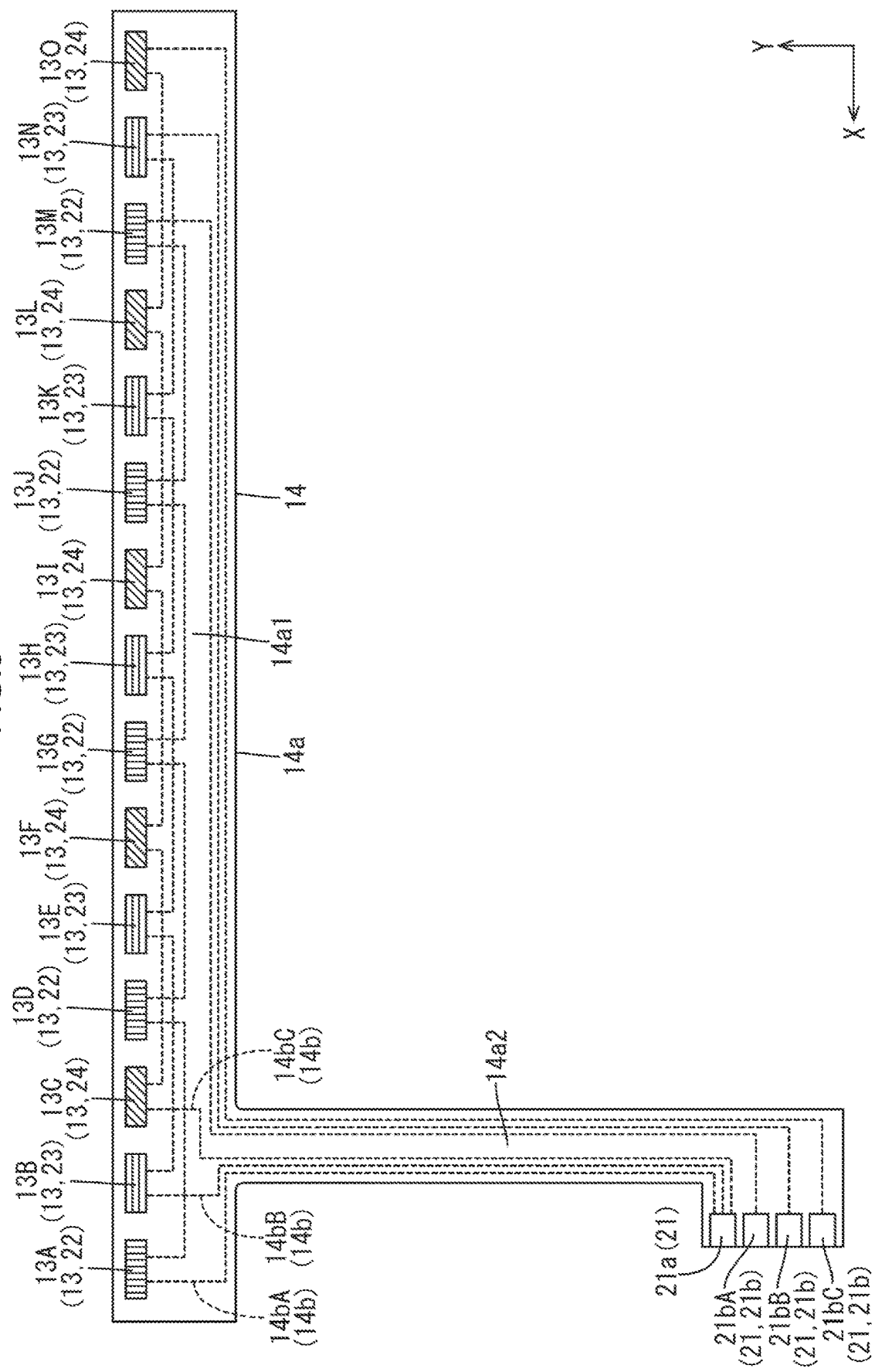
FIG. 5 is a plan view illustrating a wiring configuration of the LED board that constitutes the backlight device.

As illustrated in FIG. 1, FIG. 2 and FIG. 4, the LED board 14 is disposed on the front side with respect to the frame 18 and the light guide plate 15, and is disposed in a form of being sandwiched between these and the liquid crystal panel 11. The LED board 14 has a film-shaped (sheet-shaped) board portion (a base material) 14a that is made of an insulating material and has flexibility. The board portion 14a of the LED board 14 is composed of: an LED mounting portion 14a1 that extends along the X-axis direction; and a drawn portion 14a2 drawn from the LED mounting portion 14a1 to the outside of the frame 18 along the Y-axis direction. On a plate surface (mounting surface) on the back side in this board portion 14a, as illustrated in FIG. 5, the above-described LEDs 13 are subjected to surface mounting, and in addition, LED wiring portions (light source wiring portions) 14b for feeding electrical power to the LEDs 13 are patterned. The LED wiring portions 14b are cabled so as to straddle between the LED mounting portion 14a1 and the drawn portion 14a2 in the board portion 14a. On the LED mounting portion 14a1, 15 pieces (in FIG. 4) of the LEDs 13 are mounted in a form of being intermittently arrayed along an extending direction (the X-axis direction) of the LED mounting portion 14a1, and the respective LEDs 13 are connected in series by the above-described LED wiring portions 14b. On the board portion 14a of the LED board 14 according to the present embodiment, three routes of the LED wiring portions 14b are cabled and formed, and the totally fifteen LEDs 13 are connected thereto every ⅓, that is, every 5 pieces. An array pitch between the adjacent LEDs 13 is set substantially constant. That is, it can be said that the respective LEDs 13 are arrayed at substantially equal intervals in the X-axis direction. In the drawn portion 14a2, power feeding terminal portions 21 are provided in a form of being connected to ends of the LED wiring portions 14b. The power feeding terminal portions 21 are connected to another end side of a wiring member (not illustrated together with an LED control board) of which one end side is connected to the LED control board, thus making it possible to receive power feeding for the LED wiring portions 14b from the LED control board through the wiring member. Note that configurations and the like of the LED wiring portions 14b and the power feeding terminal portions 21 in the board portion 14a will be described later in detail.

The light guide plate 15 is made of a substantially transparent resin material (for example, an acrylic resin such as PMMA, a polycarbonate and the like), and has a refractive index sufficiently higher than air. As illustrated in FIG. 1 and FIG. 2, the light guide plate 15 has a longitudinally long plate shape as in the liquid crystal panel 11, and is housed in a form where a periphery thereof is surrounded by the frame 18. In addition, the light guide plate 15 is disposed at a position immediately under the liquid crystal panel 11 and the optical sheet 16, in which a long side direction coincides with the X-axis direction, a short side direction coincides with the Y-axis direction, and a thickness direction coincides with a Z-axis direction of the respective drawings. As illustrated in FIG. 2 and FIG. 3, in the light guide plate 15, among outer peripheral end surfaces thereof, an end surface on one (a left side illustrated in FIG. 2) long side is formed as a light incident end surface (an end surface facing the light source) 15a that faces the LEDs 13 and on which the light sent from the LEDs 13 is incident. In contrast, residual three end surfaces (an end surface on another long side and end surfaces on a pair of short sides) are formed as non-light incident end surfaces (end surfaces which do not face the light source) 15d which do not face the LEDs 13 and do not directly receive the light of the LEDs 13. This light incident end surface 15a is parallel to the light emitting surfaces 13a of the LEDs 13, and linearly extends along the X-axis direction (an array direction of the LEDs 13). In the light guide plate 15 between a front and back pair of plate surfaces thereof, a plate surface directed to the front side (toward the liquid crystal panel 11) is defined as a light exit plate surface 15b through which light exits toward the liquid crystal panel 11, and a plate surface directed to the back side is defined as a light exit opposite plate surface 15c opposite to the light exit plate surface 15b. The light exit plate surface 15b is parallel to a plate surface (the display surface 11DS) of the liquid crystal panel 11, and forms a shape facing a plate surface of the liquid crystal panel 11 with the optical sheet 16, which will be mentioned next, therebetween. In accordance with such a configuration, the light guide plate 15 has functions to introduce light, which is emitted from the LEDs 13 along the Y-axis direction, from the light incident end surface 15a, and to erect the light along the Z-axis direction after propagating the light therein, and then emit the light from the light exit plate surface 15b toward the optical sheet 16 (the front side, the light emission side).

As illustrated in FIG. 1 and FIG. 2, the optical sheet 16 has a longitudinally lone plate shape as in the liquid crystal panel 11 and the light guide plate 15, and plate surfaces thereof are parallel to the plate surfaces of the liquid crystal panel 11 and the light guide plate 15. In addition, the optical sheet 16 is disposed in a form of being interposed between the liquid crystal panel 11 and the light guide plate 15 in the Z-axis direction, thereby having a function to emit the emission light, which is sent from the light guide plate 15, toward the liquid crystal panel 11 while giving a predetermined optical action thereto. Specifically, the optical sheet 16 according to the present embodiment is composed of three sheets which are: a micro-lens sheet 16a that gives an isotropic focusing to light; a prism sheet 16b that gives anisotropic focusing to light; and a reflective polarizing sheet 16c that polarizes and reflects light. In the optical sheet 16, the micro-lens sheet 16a, the prism sheet 16b and the reflective polarizing sheet 16c are laminated on one another in this order from the back side.

As illustrated in FIG. 1 and FIG. 2, the reflective sheet 17 disposed in a form where a plate surface thereof is parallel to the plate surfaces of the liquid crystal panel 11 and the light guide plate 15 and covers the light exit opposite plate surface 15c of the light guide plate 15. The reflective sheet 17 is excellent in light reflectivity, and can efficiently erect light, which leaks from the light exit opposite plate surface 15c of the light guide plate 15, toward the front side (the light exit plate surface 15b). The reflective sheet 17 has an outer shape slightly larger than the light guide plate 15, and is disposed in a form where an end on one long side protrudes toward the LEDs 13 more than the light incident end surface 15a.

The frame 18 is made of a synthetic resin (for example, made of polycarbonate) having a white front surface, and as illustrated in FIG. 1 and FIG. 2, has an outer shape formed into a frame shape slightly larger than the light guide plate 15. The frame 18 is disposed in a form of surrounding the LEDs 13, the light guide plate 15 and the like collectively. A front-side surface of the frame 18 is attached with the adhesive applied on the back side of the already described fixing tape 10FT having light shielding properties, whereby the frame 18 fixed to the liquid crystal panel 11 with the fixing tape 10FT interposed therebetween.

Herein, a detailed description will be given of the configurations of the LED wiring portions 14b and the power feeding terminal portions 21 in the hoard portion 14a of the LED board 14. As illustrated in FIG. 5, in the LED wiring portions 14b, a major part thereof is cabled in the LED mounting portion 14a1 of the board portion 14a in a form of extending in the longitudinal direction (the X-axis direction, the array direction of the LEDs 13) thereof, and is then connected to the LEDs 13 as connection targets. In contrast, both end side portions of the LED wiring portions 14*b* are cabled in the drawn portion 14*a*2 of the board portion 14*a*, and both ends thereof are connected to the power feeding terminal portions 21. As already described, three routes of the LED wiring portions 14*b* are cabled and formed in the board portion 14*a*. Each of these three LED wiring portions 14*b* is cabled in a form of sandwiching two LEDs 13 which are not connection targets of its own (which are connection targets of the other LED wiring portions 14*b*) between the LEDs 13 which are connection targets of its own. That is, the LEDs 13 adjacent to one another in the X-axis direction in the board portion 14*a* are connected to the LED wiring portions 14*b* of the routes different from one another. Note that, hereinafter, in order from left ends illustrated in FIG. 4 and FIG. 5, the fifteen LEDs 13 arrayed along the X-axis direction in the LED mounting portion 14*a*1 are defined as a "first LED", a "second LED", a "third LED" . . . a "13th LED", a "14th LED" and a "15th LED", of which reference symbols are added with indices A, B, C, . . . , M, N, and O, respectively. When the LEDs 13 are collectively referred to without distinguishing the same from one another, the indices are not added to the reference symbols thereof.

Figure 6:
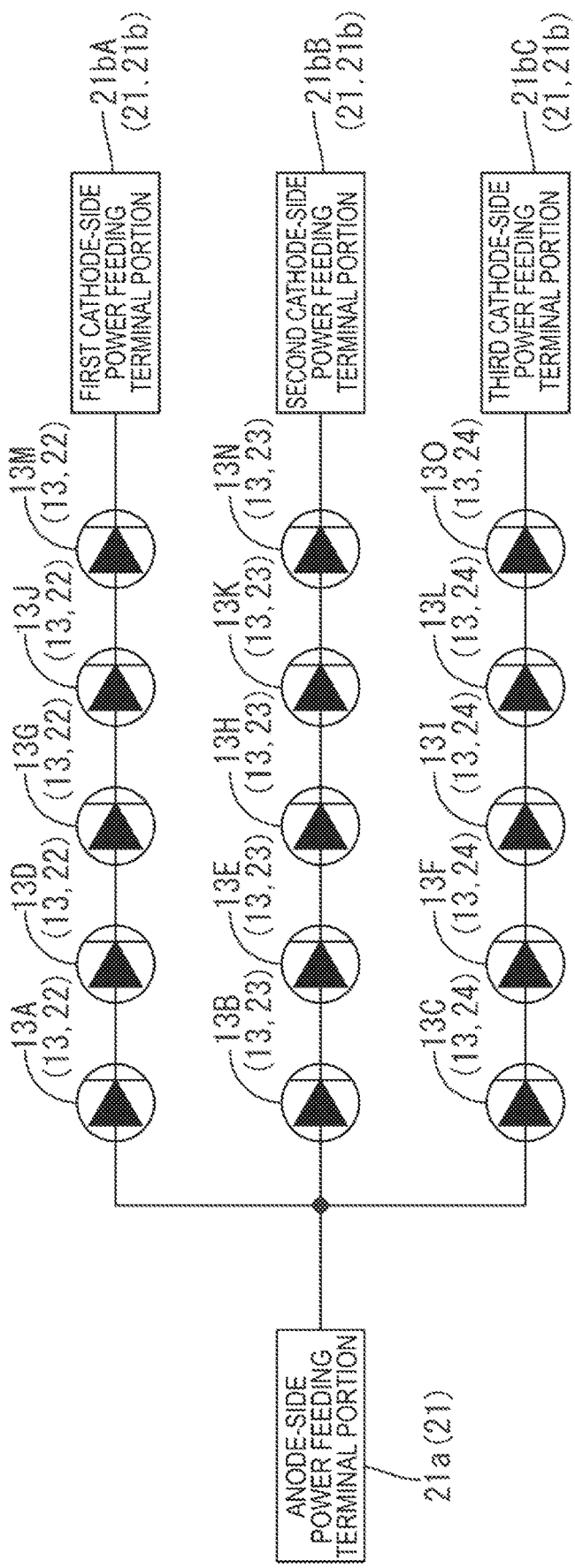
FIG. 6 is a circuit diagram illustrating an electrical connection of LEDs in the LED board.

More specifically, as illustrated in FIG. 5 and FIG. 6, the LED wiring portions 14*b* include a first LED wiring portion 14*b*A connected to the first LED 13A and the like, a second LED wiring portion 14*b*B connected to the second LED 13B and the like, and a third LED wiring portion 14*b*C connected to the third LED 13C and the like. Note that, in the case of distinguishing the LED wiring portions 14*b* from one another, the indices A, B and C are added respectively to the reference symbols of the first LED wiring portion, the second LED wiring portion and the third LED wiring portion, and in the case of collectively referring to the LED wiring portions 14*b* without distinguishing the same from one another, the indices are not added to the reference symbols. The first LED wiring portion 14*b*A is connected to the first LED 13A, the fourth LED 13D, the seventh LED 13G, the tenth LED 13J, and the 13th LED 13M. These five LEDs 13A, 13D, 13G, 13J and 13M constitute a first LED group (a first light source group) 22 that is collectively turned on following energization of the first LED wiring portion 14*b*A. The second LED wiring portion 14*b*B is connected to the second LED 13B, the fifth LED 13E, the eighth LED 13H, the eleventh LED 13K, and the 14th LED 13N. These five LEDs 13B, 13E, 13H, 13K and 13N constitute a second LED group (a second light source group) 23 that is collectively turned on following energization of the second LED wiring portion 14*b*B. The third LED wiring portion 14*b*C is connected to the third LED 13C, the sixth LED 13F, the ninth LED 13I, the twelfth LED 13L, and the 15th LED 13O. These five LEDs 13C, 13F, 13I, 13L and 13O constitute a third LED group (a third light source group) 24 that is collectively turned on following energization of the third LED wiring portion 14*b*C.

As illustrated in FIG. 5 and FIG. 6, the power feeding terminal portion 21 includes: an anode-side power feeding terminal portion 21*a* connected to an anode-side end in the LED wiring portion 14*b*; and cathode-side power feeding terminal portions 21*b* connected to cathode-side ends in the LED wiring portions 14*b*. The anode-side power feeding terminal portion 21*a* of which the number is only one is provided and shared by the three LED wiring portions 14*b*, and meanwhile, the cathode-side power feeding terminal portions 21*b* of which the number is equivalent to the number of routes of the LED wiring portions 14*b*, that is three are provided. The three cathode-side power feeding terminal portions 21*b* include: a first cathode-side power feeding terminal portion 21*b*A connected to a cathode-side end in the first LED wiring portion 14*b*A; a second cathode-side power feeding terminal portion 21*b*B connected to a cathode-side end in the second LED wiring portion 14*b*B; and a third cathode-side power feeding terminal portion 21*b*C connected to a cathode-side end in the third LED wiring portion 14*b*C. Note that, in the case of distinguishing the cathode-side power feeding terminal portions 21*b* from one another, indices A, B and C are added respectively to reference symbols of the first cathode-side power feeding terminal portion, the second cathode-side power feeding terminal portion and the third cathode-side power feeding terminal portion, and in the case of collectively referring to the cathode-side power feeding terminal portions 21*b* without distinguishing the same from one another, the indices are not added to the reference symbols.

Figure 7:
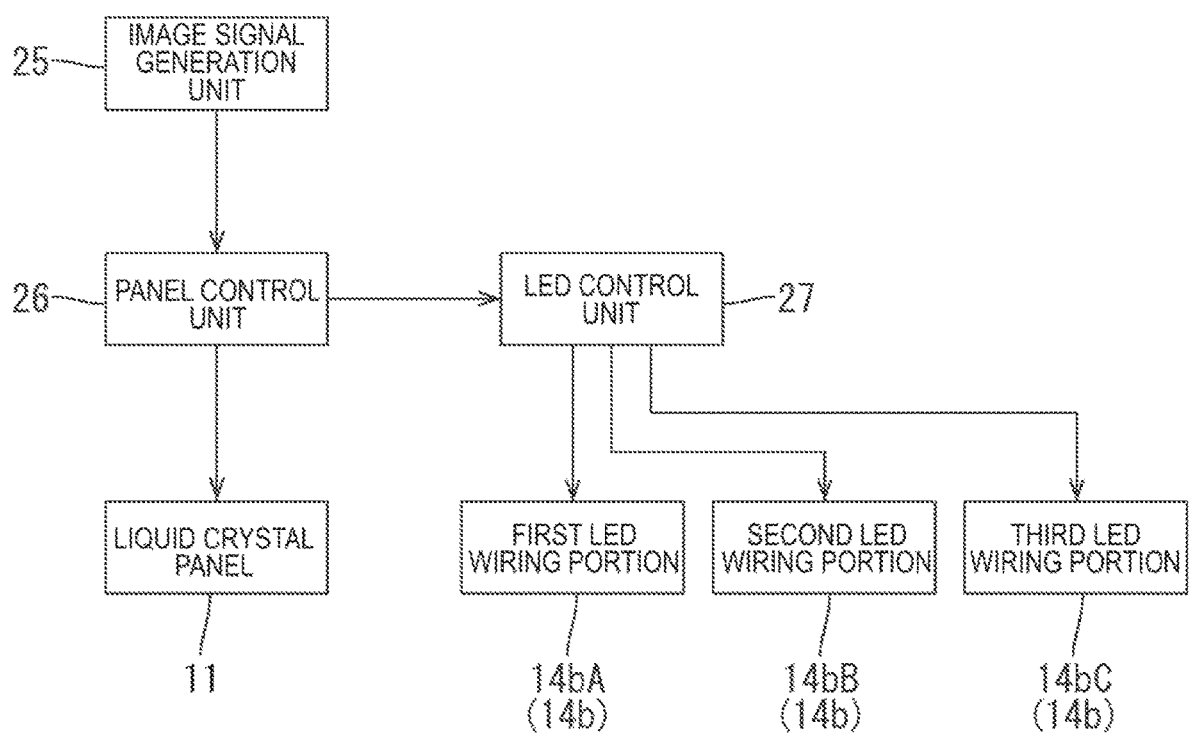
FIG. 7 is a block diagram illustrating an electrical configuration of the liquid crystal display device.
Figure 8:
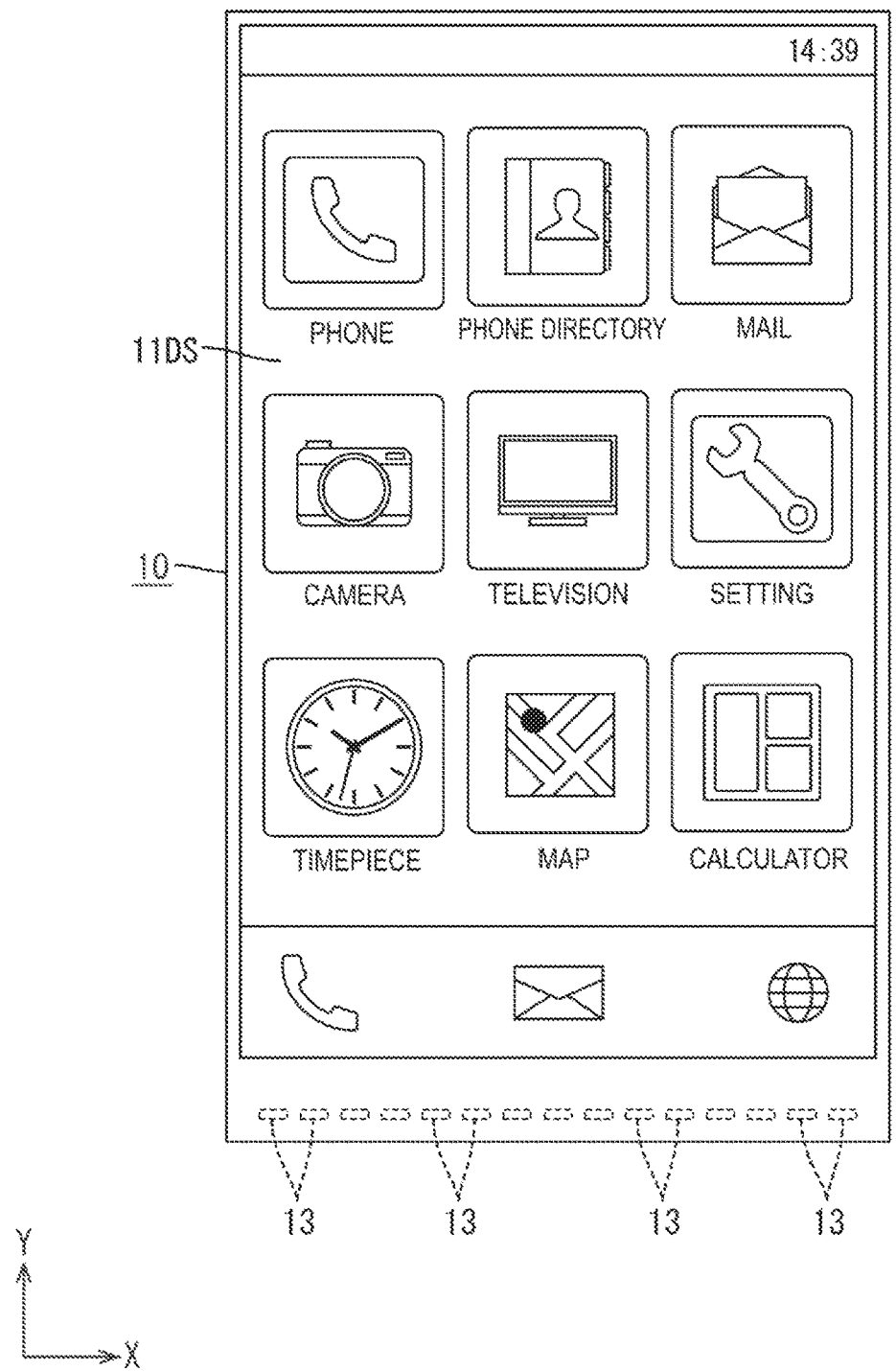
FIG. 8 is a plan view illustrating a state where a normal image is displayed on a display surface of the liquid crystal display device.

Subsequently, a description will be given of a configuration regarding the control of the liquid crystal panel 11 and the backlight device 12. The liquid crystal panel 11 is driven on the basis of a signal supplied from the panel control board connected thereto through the flexible board 20. As illustrated in FIG. 7, the panel control board is provided with: an image signal generation unit 25 that generates an image signal related to an image displayed on the liquid crystal panel 11; a panel control unit 26 that controls the liquid crystal panel 11 on the basis of the image signal generated in the image signal generation unit 25. The image signal generation unit 25 generates image signals related to two types of images in which display ranges on the display surface 11DS of the liquid crystal panel 11 are different from each other. Specifically, the image signal generation unit 25 can individually generate: an image signal related to a normal image (see FIG. 8) in which a display range (an display area) on the display surface 11DS of the liquid crystal panel 11 is substantially an entire region of the display region; and an image signal related to a small image (see FIG. 9 to FIG. 11) in which a display range on the display surface 11DS is smaller than that of the normal image. When a user performs a specific operation (for example, an operation of depressing a sleep release button of a smartphone set to a sleep state, and the like), the image signal generation unit 25 generates an image signal related to the small image, and meanwhile, when the specific operation is not performed, the image signal generation unit 25 generates the image signal related to the normal image. Note that, in FIG. 8, an image in which icons are arrayed in a matrix is illustrated as an example of the normal image; however, besides this, the normal image also includes, for example, images in a state where a variety of applications are started, and the like.

Figure 9:
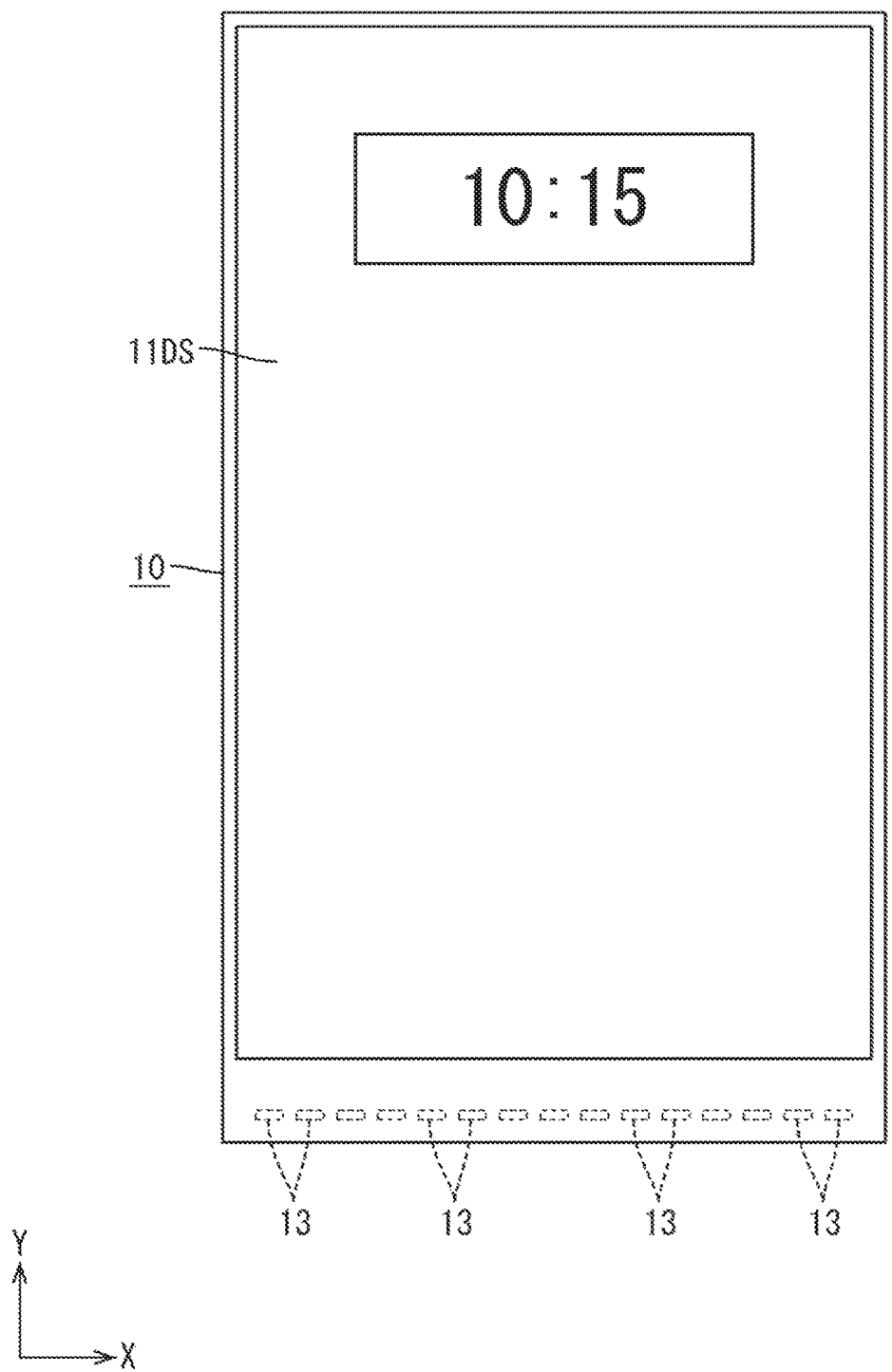
FIG. 9 is a plan view illustrating a state where a first small image is displayed on the display surface of the liquid crystal display device.
Figure 10:
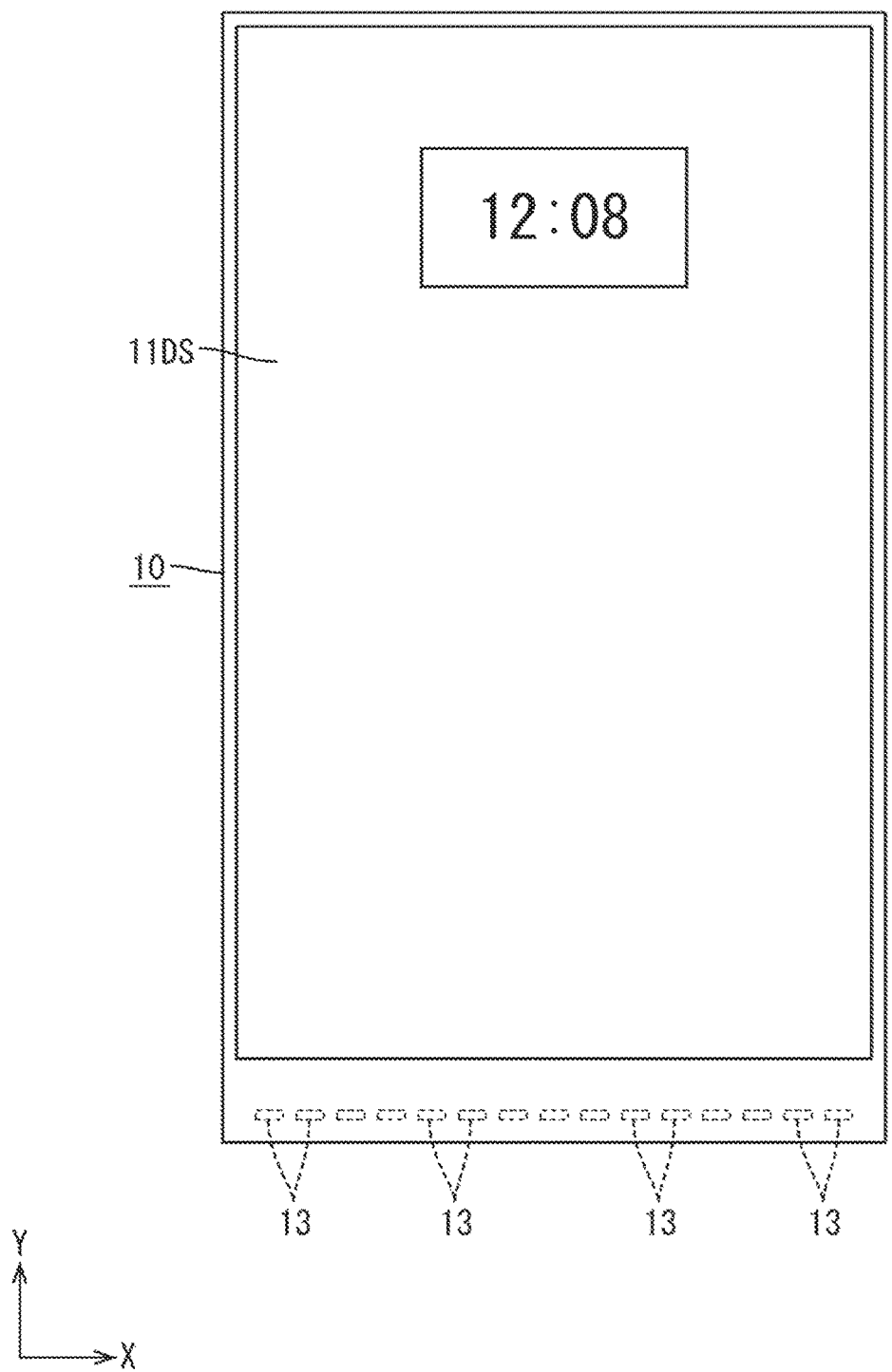
FIG. 10 is a plan view illustrating a state where a second small image is displayed on the display surface of the liquid crystal display device.
Figure 11:
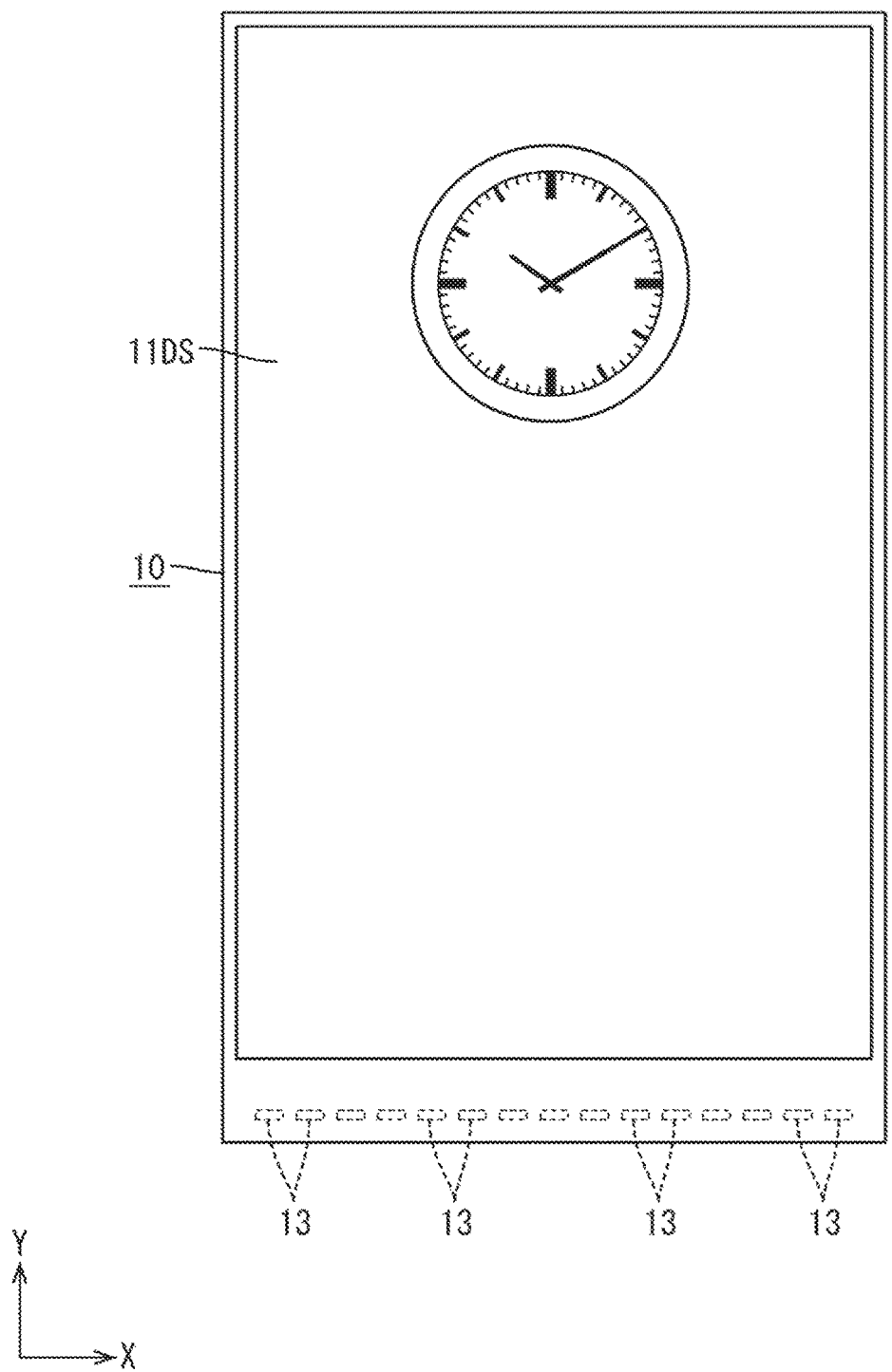
FIG. 11 is a plan view illustrating a state where a third small image is displayed on the display surface of the liquid crystal display device.

In a smartphone in which the liquid crystal display device 10 according to the present embodiment, the above-described small image corresponds, for example, to a "standby screen", and specifically, is images of a timepiece, which are as illustrated in FIG. 9 to FIG. 11 and occupy a small part of the display region. Multiple types of this "standby screen", that is, of the small image are stored in a memory (not illustrated). An operation of a user makes it possible to appropriately select one from among such small images and to display the selected image on the display surface 11DS of the liquid crystal panel 11. Each of the small images has a display range that occupies only a part of the display region, and this display range is smaller than that of the normal image illustrated in FIG. 8. More specifically, each of the small images illustrated in FIG. 9 and FIG. 10 is an image of a digital-type timepiece having a laterally long shape. FIG. 9 illustrates an image of a relatively large timepiece with a wide display range, and FIG. 9 illustrates an image of a relatively small timepiece with a small display range. Meanwhile, a small image illustrated in FIG. 11 is an image of an analog-type timepiece that is circular, and a display range thereof in the Y-axis direction is larger than that of each of the small images illustrated in FIG. 9 and FIG. 10; however, a display range thereof in the X-axis direction is smaller than that of the small image illustrated in FIG. 9 and is larger than that of the small image illustrated in FIG. 10. As described above, the display range and the display position of the small image are variable by the operation of the user. Note that an outside of the display range of the small image is displayed with a minimum gradation, that is, is displayed black.

In the liquid crystal display device 10 illustrated in FIG. 8 to FIG. 11, the LEDs 13 and the light incident end surface 15a of the light guide plate 15 are arranged to be biased to a lower end surface of each of the drawings. In contrast, as illustrated in FIG. 9 to FIG. 11, the small image is displayed in form of being biased to an upper side of each of the drawings. That is, the image signal generation unit 25 generates the image signal, which is related to the small image, such that the small image is disposed in a form of being bias to the non-light incident end surface 15d opposite to the light incident end surface 15a in the surface of the light exit plate surface 15b in the light guide plate 15. As illustrated in FIG. 2 and FIG. 4, the backlight device 12 according to the present embodiment, is constituted as a so-called one-side light-incident type in which one of the outer peripheral end surfaces of the light guide plate 15 is the light incident end surface 15a. Accordingly, when light is incident on the light incident end surface 15a from the LEDs 13 arrayed along the light incident end surface 15a, then on a portion of the light exit plate surface 15b of the light guide plate 15, the portion being close to the light incident end surface 15a, there occur bright portions which overlap light emission ranges of the respective LEDs 13 and dark portions which do not overlap the light emission ranges of the respective LEDs 13, and as tendency, unevenness in luminance is prone to be visually recognized. In contrast, as illustrated in FIG. 9 to FIG. 11, the small image displayed on the liquid crystal panel 11 by the panel control unit 26 on the basis of the image signal related to the small image and generated by the image signal generation unit 25 is disposed in the form of being biased to the non-light incident end surface 15d opposite to the light incident end surface 15a in the surface of the light exit plate surface 15b in the light guide plate 15. Accordingly, such a portion of the light exit plate surface 15b as described above, the portion being close to the light incident end surface 15a, is displayed black, and the unevenness in luminance, which can occur there, becomes less likely to be visually recognized. In this way, the small image becomes less likely to be affected by the unevenness in luminance, which can occur in the portion of the light exit plate surface 15b, the portion being closer to the light incident end surface 15a. Accordingly, display quality at the time of displaying the small image on the liquid crystal panel 11 becomes excellent.

Meanwhile, the backlight device 12 is driven on the basis of the signal (power) supplied from the LED control board connected to the LED board 14 through the wiring member. As illustrated in FIG. 7, the LED control board is provided with an LED control unit (a light source control unit) 27 that controls the respective LEDs 13 by feeding power to the respective LED wiring portions 14b. Then, the above-described panel control board and the LED control board are connected to each other by the wiring member (not illustrated), whereby the image signal generated in the image signal generation unit 25 is supplied to the LED control unit 27 through the panel control unit 26. In this way, the LED control unit 27 can control the respective LEDs 13 on the basis of the image signal generated in the image signal generation unit 25. Specifically, in the present embodiment, when the image based on the image signal sent from the image signal generation unit 25 is the normal image, the LED control unit 27 energizes all (relatively many) of the three LED wiring portions 14bA to 14bC, and meanwhile, when the image is the small image, the LED control unit 27 selectively energizes only one (relatively a few) of the three LED wiring portions 14bA to 14bC. Hence, when the image signal related to the normal image is generated in the image signal generation unit 25, the liquid crystal panel control unit 26 displays the normal image on substantially the entire region of the display surface 11DS of the liquid crystal panel 11 based on the image signal. At this time, the LED control unit 27 applies a voltage between the anode-side power feeding terminal portion 21a and the three cathode-side power feeding terminal portions 21bA to 21bC on the basis of the image signal related to the normal image, and energizes all of the three LED wiring portions 14bA to 14bC. Accordingly, all (15 pieces) of the LEDs 13A to 13O which belong to the respective LED groups 22 to 24 connected to these LED wiring portions 14bA to 14bC are turned on. By using light of all of the LEDs 13A to 13O, the user can be caused to visually recognize the normal image displayed on the liquid crystal panel 11.

Meanwhile, when the image signal related to the small image is generated in the image signal generation unit 25, the liquid crystal panel control unit 26 displays the small image on a part of the display surface 11DS of the liquid crystal panel 11 based on the image signal. At this time, the LED control unit 27 selectively applies a voltage between the anode-side power feeding terminal portion 21a and the second cathode-side power feeding terminal portion 21bB among the three cathode-side power feeding terminal portions 21bA to 21bC on the basis of image signal related to the small image, and selectively energizes only the second LED wiring portion 14bB among the three LED wiring portions 14bA to 14bC. Accordingly, the five LEDs 13B, 13E, 13H, 13K and 13N which constitute the second LED group 23 connected to the second LED wiring portion 14bB are selectively turned on. By using light of these five LEDs 13B, 13E, 13H, 13K and 13N (the second LED group 23), the user can be caused to visually recognize the small image displayed on the liquid crystal panel 11. The second LED wiring portion 14bB energized at this time is connected to the five LEDs 13B, 13E, 13H, 13K and 13N (the second LED group 23) such that the LEDs 13 adjacent to one another have different connection targets. Accordingly, the light can be applied to a wide range of the liquid crystal panel 11, whereby display of the small image can be good even if the display range and the display position of the small image in the surface of the liquid crystal panel 11 vary. As described above, only when the small image is displayed, the specific second LED wiring portion 14bB is selectively energized, and accordingly, the power consumption can be reduced more than when all of the LED wiring portions 14bA to 14bC are energized. In addition, in comparison with the conventional case of adjusting the number and positions of the LEDs, which are to be turned on, in response to the display range and display position of the image to be displayed, a circuit configuration and control of the LEDs 13 are simplified even if the display range and the display position of the small image vary as illustrated in FIG. 9 to FIG. 11.

In addition, as illustrated in FIG. 4 and FIG. 5, each of the five LEDs 13B, 13E, 13H, 13K and 13N (the second LED group 23) connected to the second LED wiring portion 14bB selectively energized by the LED control unit 27 at the time of displaying the small image is disposed on a center side with respect to the first LED 13A and the 15th LED 13O, each of which is located on the end of the light incident end surface 15a of the light guide plate 15. That is, to the second LED wiring portion 14bB, neither the first LED 13A nor the 15th LED 13O, each of which is located on the end of the light incident end surface 15a of the light guide plate 15, is connected. In other words, the first LED 13A and the 15th LED 13O, which are located on the end of the light incident end surface 15a of the light guide plate 15, are connected respectively to the first LED wiring portion 14bA and the third LED wiring portion 14bC, which are not energized at the time of displaying the small image. Herein, among the LEDs 13A to 13O arrayed along the light incident end surface 15a of the light guide plate 15, with regard to the first LED 13A and the 15th LED 13O, which are located on the end of the light incident end surface 15a, light thereof emitted following the turning on is less likely to effectively incident on the light incident end surface 15a than that of the LEDs 13b to 13N located on the center side with respect to the first LED 13A and the 15th LED 13O. Meanwhile, when the number of LEDs 13B, 13E, 13H, 13K and 13N connected to the second LED wiring portion 14bB selectively energized by the LED control unit 27 when the image is the small image is limited. Accordingly, a quantity of light supplied to the liquid crystal panel 11 at the time of displaying the small image is apt to be insufficient. In this regard, to the second LED wiring portion 14bB selectively energized by the LED control unit 27 when the image is the small image as described above, connected is neither the first LED 13A nor the 15th LED 13O, each of which is located on the end of the light incident end surface 15a. Accordingly, the light emitted from the LEDs 13B, 13E, 13H, 13K and 13N (the second LED group 23) connected to the above-described second LED wiring portion 14bB at the time of displaying the small image is made easy to effectively incident on the light incident end surface 15a. In this way, the quantity of light supplied to the liquid crystal panel 11 becomes sufficient, and display quality of the displayed small image is improved.

Moreover, as illustrated in FIG. 4 and FIG. 5, in each of the respective LED wiring portions 14b, intervals between the LEDs 13 serving as the connection targets thereof are set substantially equal to one another. The LEDs 13 as the connection targets, the number of which is five for each of the LED wiring portions 14b, are arranged to be dispersed from one end of the light incident end surface 15a to the other end thereof in the array direction (the X-axis direction) of the LEDs 13. Hence, the LEDs 13B, 13E, 13H, 13K and 13N (the second LED group 23) connected to the second LED wiring portion 14bB selectively energized by the LED control unit 27 at the time of displaying the small image are also arranged at substantially equal intervals in the array direction of the LEDs 13, and are dispersed from one end of the light incident end surface 15a to the other end thereof. In accordance with such a configuration, as the second LED wiring portion 14bB is energized at the time when the small image is displayed, the LEDs 13B, 13E, 13H, 13K and 13N (the second LED group 23) dispersed from one end side of the light incident end surface 15a to the other end thereof are turned on, thus making it possible to apply light to a wider range of the liquid crystal panel 11. In this way, even if the display range and the display position of the small image in the surface of the liquid crystal panel 11 vary, the display of the small image is improved more.

Moreover, the image signal generation unit 25 generates the image signal such that the normal image has more gradations than the small image, and that the small image has a smaller number of gradations than the normal image. Specifically, at the time of displaying the normal image illustrated in FIG. 8, the image signal generation unit 25 drives each of the red pixel portions 11RPX, the green pixel portions 11GPX and the blue pixel portions 11BPX in the three primary colors by 256 gradations (8 bits). Accordingly, the number of colors of the normal image is approximately 16,770,000 colors (24 bits), that is, "true color" is achieved. In contrast, at the time of displaying the small image illustrated in each of FIG. 9 to FIG. 11, the image signal generation unit 25 drives each of the red pixel portions 11RPX, the green pixel portions 11GPX and the blue pixel portions 11BPX in the three primary colors by two gradations (1 bit). Accordingly, the number of colors of the small image is eight colors (3 bits), which is extremely smaller than the number of colors of the normal image. As described above, at the time of displaying the small image on the liquid crystal panel 11, when the number of gradations of the small image is smaller than that of the normal image, power related to the drive of the liquid crystal panel 11 can be reduced, whereby the power consumption can be further reduced.

As described above, the liquid crystal display device (the display device) 10 according to the present embodiment includes: the liquid crystal panel (the display panel) 11 that displays an image; the backlight device (the lighting device) 12 that supplies light for the display to the liquid crystal panel 11, the backlight device 12 at least including the LEDs (light sources) 13 arrayed at intervals and the LED wiring portions (light source wiring portions) 14b connected to the LEDs 13 such that the LEDs 13 adjacent to one another have different connection targets; the image signal generation unit 25 that generates an image signal related to the image; the panel control unit 26 that displays the image on the liquid crystal panel 11 on the basis of the image signal generated in the image signal generation unit 25; and the LED control unit (the light source control unit) 27 that energizes relatively many of the LED wiring portions 14b when the image based on the image signal sent from the image signal generation unit 25 is a normal image, and selectively energizes relatively a few of the LED wiring portions 14b when the image is a small image of which a display range is smaller than a display range of the normal image.

In this way, when the image signal generated in the image signal generation unit 25 is input to the panel control unit 26, the panel control unit 26 displays the image on the liquid crystal panel 11 on the basis of the image signal. The LED control unit 27 controls the LEDs 13 on the basis of the image signal sent from the image signal generation unit 25. Herein, when the image based on the image signal is the normal image, then in comparison with the case of the small image to be described next, the LED control unit 27 energizes relatively many of the LED wiring portions 14b connected to the LEDs 13 such that the LEDs 13 adjacent to one another have different connection targets. Accordingly, the LEDs 13 connected to these LED wiring portions 14b turn on, and by using light thereof, the normal image is displayed on the liquid crystal panel 11. Meanwhile, when the image based on the image signal is the small image of which a display range is smaller than that of the normal image, the LED control unit 27 selectively energizes relatively a few of the LED wiring portions 14*b*. Accordingly, the LEDs 13 connected to the specific energized LED wiring portions 14*b* turn on, and by using light thereof, the small image is displayed on the liquid crystal panel 11. The LED wiring portions 14*b* energized at this time are connected to the LEDs 13 such that the LEDs 13 adjacent to one another have different connection targets. Accordingly, the light can be applied to a wide range of the liquid crystal panel 11, whereby display of the small image can be good even if the display range and the display position of the small image in the surface of the liquid crystal panel 11 vary. As described above, only when the small image is displayed, the specific second LED wiring portion 14*b*B that is the specific LED wiring portion 14*b* is selectively energized, and accordingly, the power consumption can be reduced. In addition, in comparison with the conventional case of adjusting the number and positions of the LEDs, which are to be turned on, in response to the display range and display position of the image to be displayed, the circuit configuration and control of the LEDs 13 are simplified.

Moreover, the backlight device 12 at least includes the light guide plate 15 having a plate shape in which one of outer peripheral end surfaces is formed as a light incident end surface 15*a* that faces the LEDs 13 and on which light is incident and either one of plate surfaces is the light exit plate surface 15*b* through which light exits. Furthermore, in the backlight device 12, the LEDs 13 are arranged to be arrayed along the light incident end surface 15*a*. The image signal generation unit 25 generates the image signal related to the small image such that the small image is disposed in the form of being biased to the non-light incident end surface (the end surface) 15*d* opposite to the light incident end surface 15*a* in the surface of the light exit plate surface 15*b* in the light guide plate 15. As described above, in the backlight device 12 of the so-called one-side light-incident type in which one of the outer peripheral end surfaces of the light guide plate 15 is formed as the light incident end surface 15*a*, when light is incident on the light incident end surface 15*a* from the LEDs 13 arrayed along the light incident end surface 15*a*, then as tendency, unevenness in luminance is prone to be visually recognized on the portion of the light exit plate surface 15*b* of the light guide plate 15, the portion being close to the light incident end surface 15*a*. In contrast, the small image displayed on the liquid crystal panel 11 by the panel control unit 26 on the basis of the image signal related to the small image and generated by the image signal generation unit 25 is disposed in the form of being biased to the non-light incident end surface 15*d* opposite to the light incident end surface 15*a* in the surface of the light exit plate surface 15*b* in the light guide plate 15. Accordingly, the small image becomes less likely to be affected by the unevenness in luminance, which can occur in such a portion of the light exit plate surface 15*b* as described above, the portion being close to the light incident end surface 15*a*. In this way, the display quality at the time of displaying the small image on the liquid crystal panel 11 becomes excellent.

Moreover, the backlight device 12 at least includes the light guide plate 15 having a plate shape in which one of outer peripheral end surfaces is formed as the light incident end surface 15*a* that faces the LEDs 13 and on which light is incident and either one of plate surfaces is the light exit plate surface 15*b* through which light exits. Furthermore, in the backlight device 12, the LEDs 13 are arranged to be arrayed along the light incident end surface 15*a*. The LED wiring portions 14*b* are constituted such that the first LED 13A and the 15th LED 13O, which are the LEDs 13 located on the end of the light incident end surface 15*a*, are not connected to the second LED wiring portion 14*b*B that is the LED wiring portion 14*b* selectively energized by the LED control unit 27 when the image is the small image. Among the LEDs arrayed along the light incident end surface 15*a*, with regard to the first LED 13A and the 15th LED 13O, which are the LEDs 13 located on the end of the light incident end surface 15*a*, light thereof emitted following the turning on is less likely to effectively incident on the light incident end surface 15*a* than that of the LEDs 13B to 13N located on the center side with respect to the first LED 13A and the 15th LED 13O. Meanwhile, when the number of LEDs 13B, 13E, 13H, 13K and 13N connected to the second LED wiring portion 14*b*B that is the LED wiring portion 14*b* selectively energized by the LED control unit 27 when the image is the small image is limited. Accordingly, a quantity of light supplied to the liquid crystal panel 11 at the time of displaying the small image is apt to be insufficient. In this regard, to the second LED wiring portion 14*b*B that is the LED wiring portion 14*b* selectively energized by the LED control unit 27 when the image is the small image, connected is neither the first LED 13A nor the 15th LED 13O, each of which is the LED 13 located on the end of the light incident end surface 15*a*. Accordingly, the light emitted from the LEDs 13B, 13E, 13H, 13K and 13N connected to the above-described second LED wiring portion 14*b*B at the time of displaying the small image is made easy to effectively incident on the light incident end surface 15*a*. In this way, the quantity of light supplied to the liquid crystal panel 11 becomes sufficient, and display quality of the displayed small image is improved.

Moreover, the backlight device 12 at least includes the light guide plate 15 having a plate shape in which one of outer peripheral end surfaces is formed as the light incident end surface 15*a* that faces the LEDs 13 and on which light is incident and either one of plate surfaces is the light exit plate surface 15*b* through which light exits. Furthermore, in the backlight device 12, the LEDs 13 are arranged to be arrayed along the light incident end surface 15*a*. Among the LED wiring portions 14*b*, the second LED wiring portion 14*b*B that is the LED wiring portion 14*b* selectively energized by the LED control unit 27 when the image is the small image is connected to the LEDs 13B, 13E, 13H, 13K and 13N dispersed from one end of the light incident end surface 15*a* to the other end thereof. In this way, the second LED wiring portion 14*b*B that is the LED wiring portion 14*b* energized at the time when the small image is displayed is connected to the LEDs 13E, 13E, 13H, 13K and 13N dispersed from one end of the light incident end surface 15*a* to the other end thereof. Accordingly, light can be applied to a wider range of the liquid crystal panel 11. In this way, even if the display range and the display position of the small image in the surface of the liquid crystal panel 11 vary, the display of the small image is improved more.

Moreover, the liquid crystal panel 11 at least includes: the red pixel portions 11RPX which exhibit red; the green pixel portions 11GPX which exhibit green; and the blue pixel portions 11BPX which exhibit blue, and the image signal generation unit generates the image signal such that the number of gradations of the small image is smaller than that of the normal image. In this way, on the liquid crystal panel 11, color display with a predetermined gradation is performed by the red pixel portions 11RPX, the green pixel portions 11GPX and the blue pixel portions 11BPX. At the time of displaying the small image on the liquid crystal panel 11, the number of gradations of the small image is smaller than that of the normal image. Accordingly, power related to the drive of the liquid crystal panel 11 can be reduced, whereby the power consumption can be further reduced.

Other Embodiments

The present invention is not limited to the embodiment described by the above description and the drawings. For example, embodiments as below are also incorporated within the technical scope of the present invention.

(1) The above-described embodiment illustrates the case where the image signal generated in the image signal generation unit is indirectly supplied to the LED control unit while passing via the panel control unit. However, such a configuration may be adopted in which the image signal generated in the image signal generation unit is directly supplied to the LED control unit without passing via the panel control unit.

(2) The above-described embodiment illustrates the case where the image signal generated in the image signal generation unit is directly supplied to the panel control unit. However, such a configuration may be adopted in which the image signal generated in the image signal generation unit is indirectly supplied to the panel control unit. Specifically, for example, it is possible to interpose an image signal processing unit that processes the image signal between the image signal generation unit and the panel control unit.

(3) The above-described embodiment illustrates the case where, at the time of displaying the small image, the second LED group is turned on by selectively energizing the second LED group among the three LED wiring portions. However, at the time of displaying the small image, the first LED group or the third LED group may be turned on by selectively energizing the first LED wiring portion or the third LED wiring portion.

(4) The above-described embodiment illustrates the case of selectively energizing only one among the three LED wiring portions at the time of displaying the small image. However, two among the three LED wiring portions may be selectively energized at the time of displaying the small image. In that case, for example, two among the three LED wiring portions are energized at the time of displaying a specific small image (a small image that is relatively large or the like), and meanwhile, only one among the three LED wiring portions may be selectively energized at the time of displaying another small image (a small image that relatively small or the like).

(5) The above-described embodiment illustrates the case where the number of routes of the LED wiring portions is three; however, the number of routes of the LED wiring portions may be two, or four or more. When the number of routes of the LED wiring portions is two, only one LED wiring portion just needs to be selectively energized at the time of displaying the small image. Meanwhile, when the number of routes of the LED wiring portions is four or more, the LED wiring portions of which the number is smaller than a total number of the routes just need to be selectively energized at the time of displaying the small image.

(6) The above-described embodiment illustrates the configuration in which, between the LEDs connected to the same LED wiring portion, two LEDs connected to the other LED wiring portions are interposed. However, such a configuration may be adopted in which, between the LEDs connected to the same LED wiring portion, one or three or more LEDs connected to the other LED wiring portions are interposed.

(7) The above-described embodiment illustrates the configuration (an equal pitch array configuration) in which the LEDs connected to the same LED wiring portion are arrayed at substantially equal intervals. However, such a configuration (an irregular pitch array configuration) may be adopted in which all of the intervals between the LEDs connected to the same LED wiring portion are not equal.

(8) The above-described embodiment illustrates the case where the LEDs connected to the respective LED wiring portions are equal in number to one another. However, the LEDs connected to the respective LED wiring portions may be entirely or partially different in number from one another.

(9) Besides in the above-described embodiment, specific values of the total number of LEDs and the number of LEDs connected to each of the LED wiring portions are appropriately changeable. Preferably, the total number of LEDs is a value obtained by multiplying the number of routes of the LED wiring portions by the number of LEDs connected to each of the LED wiring portions; however, is not necessarily limited thereto.

(10) The above-described embodiment illustrates the case where the image signal generation unit generates the image signals related to three types of small images. However, such a configuration may be adopted in which the image signal generation unit generates image signals related to two types or four types or more of small images.

(11) Besides in the configuration illustrated in the above-described embodiment, the specific display range and display position of the small image on the display surface of the liquid crystal panel are appropriately changeable.

(12) The above-described embodiment illustrates the case where the panel control board and the LED control board are provided. However, for example, the panel control board and the LED control board may be integrated to a singly control board, and the image signal generation unit, the panel control unit, the LED control unit and the like may be provided on the control board.

(13) Besides in the above-described embodiment, specific values of the number of colors of the small image and the number of colors of the normal image are appropriately changeable. In that case, the number of colors of the small image and the number of colors of the normal image may be the same.

(14) The above-described embodiment illustrates the case where a planar shape of the liquid crystal display device (the liquid crystal panel and the backlight device) is a longitudinally long rectangle. However, the planar shape of the liquid crystal display device may be a laterally long rectangle, a square, an elliptical shape, an oval shape, a circular shape, a trapezoidal shape and the like.

(15) The above-described embodiment illustrates, as an example, the backlight device of the one-side light-incident type in which the end surface on the one short side among the outer peripheral end surfaces of the light guide plate is used as the light incident end surface. However, the backlight device may be a device of a one-side light-incident type in which an end surface on one short side among the outer peripheral end surfaces of the light guide plate is used as the light incident end surface. Moreover, the backlight device may be a device of a both-side light-incident type in which a pair of end surfaces on the long side or a pair of end surfaces on the short side among the outer peripheral end surfaces of the light guide plate are individually used as the light incident end surfaces. Furthermore, the backlight device may be a device of three-side light-incident type in which arbitrary three end surfaces among the outer peripheral end surfaces of the light guide plate are individually used as the light incident end surfaces, or may be a backlight device of four-side light-incident type in which all of the outer peripheral end surfaces of the light guide plate are used as the light incident end surfaces.

(16) The above-described embodiment illustrates as an example the backlight device of the edge light type. However, the present invention is also applicable to a direct backlight device. In that case, the direct backlight device is a device that does not include the light guide plate provided in the backlight device of the edge light type. In the direct backlight device, an LED board is disposed such that a mounting surface for LEDs faces a plate surface of an optical sheet with a gap interposed therebetween. In the LED board, preferably, the LEDs are installed so as to be arranged in a matrix in a surface of a bottom of the backlight device. Moreover, preferably, a reflective sheet is installed in a form of covering the mounting surface of the LED substrate, and LED insertion holes through which the LEDs are inserted are formed in the reflective sheet. Furthermore, it is also possible to install a diffusion lens that diffuses light in form of covering light emitting surfaces of the LEDs.

(17) Besides in the above-described embodiment, specific number, type, lamination order and the like of the optical sheets for use in the backlight device are appropriately changeable.

(18) Besides in the above-described embodiment, the reflective sheet that covers the light exit opposite plate surface of the light guide plate may be omitted.

(19) Besides in the above-described respective embodiments, the number of use of the LED board is appropriately changeable.

(20) The above-described embodiment illustrates the LEDs of the side surface emission type; however, LEDs of a top emission type are also usable as the light sources. Moreover, light sources (organic ELs and the like) other than the LEDs are also usable.

(21) The above-described embodiment illustrates as an example the liquid crystal panel in which the color filters are those of three colors which are red, green, and blue. However, the present invention is also applicable to a liquid crystal panel including color filters of four colors composed by adding yellow or white to red, green and blue.

(22) The above-described embodiment illustrates as an example the liquid crystal panel configured such that the liquid crystal layer is sandwiched between a pair of substrates. However, the present invention also applicable to a display panel in which functional organic molecules (a medium layer) other than the liquid crystal material are sandwiched between a pair of substrates.

(23) In the above-described embodiment, TFTs are used as the switching elements of the liquid crystal panel. However, the present invention is also applicable to a liquid crystal panel using switching elements (for example, thin film diodes (TFDs)) other than the TFTs, and is also applicable to a liquid crystal panel that performs monochromatic display as well as the liquid crystal panel that performs color display.

(24) The above-described embodiment illustrates as an example the liquid crystal display device including the liquid crystal panel classified as a compact one. However, the present invention is also applicable to a liquid crystal display device including a liquid crystal panel classified as a middle-compact, middle, or large (extra-large) one, for example, with a screen size of from 10 inches to 100 inches. In that case, the liquid crystal display device is usable as an electronic instrument such as a television receiving device, an electronic billboard (a digital signage) and an electronic blackboard. Moreover, the liquid crystal display device including the liquid crystal panel classified as a compact one may be used for a portable electronic instrument such as a tablet-type personal computer as well as for the smartphone.

(25) The above-described embodiment illustrates the liquid crystal panel as an example of a display panel. However, the present invention is also applicable to display panels (a micro electro mechanical systems (MEMS) display panel and the like) of other types.

EXPLANATION OF SYMBOLS

10: Liquid crystal display device (Display device)
11: Liquid crystal panel (Display panel)
11BPX: Blue pixel portion
11GPX: Green pixel portion
11RPX: Red pixel portion
12: Backlight device (Lighting device)
13: LED (Light source)
14b: LED wiring portion (Light source wiring portion)
15: Light guide plate
15a: Light incident end surface
15b: Light exit plate surface
15d: Non-light incident end surface (End surface)
25: Image signal generation unit
26: Panel control unit
27: LED control unit (Light source control unit)

The invention claimed is:

1. A display device comprising:
a display panel that displays an image;
a lighting device that supplies light to the display panel for displaying, the lighting device at least including a plurality of light sources arrayed at intervals and a plurality of light source wiring portions connected to the plurality of light sources such that the light sources adjacent to one another have different connection targets;
an image signal generation unit that generates an image signal related to the image;
a panel control unit that displays the image on the display panel based on the image signal generated in the image signal generation unit; and
a light source control unit that energizes a relatively great amount of the plurality of light source wiring portions when the image based on the image signal sent from the image signal generation unit is a normal image, and selectively energizes a relatively small amount of the plurality of light source wiring portions when the image is a small image of which a display range is smaller than a display range of the normal image;
wherein the lighting device at least includes a light guide plate having a plate shape in which one of outer peripheral end surfaces is formed as a light incident end surface that faces the plurality of light sources and on which light is incident and either one of plate surfaces is a light exit plate surface through which light exits, and the plurality of light sources are arranged to be arrayed along the light incident end surface, and
the image signal generation unit generates the image signal related to the small image such that the small image is disposed in a form of being biased to an end surface opposite to the light incident end surface in a surface of the light emitting plate surface in the light guide plate.

2. The display device according to claim 1, wherein
the plurality of light source wiring portions are constituted such that the light sources located on an end of the light incident end surface are not connected to the light source wiring portions selectively energized by the light source control unit when the image is the small image.

3. The display device according to claim 1, wherein among the plurality of light source wiring portions, the light source wiring portion selectively energized by the light source control unit when the image is the small image is connected to the plurality of light sources dispersed from one end of the light incident end surface to another end of the light incident end surface.

4. The display device according to claim 1, wherein the display panel at least includes red pixel portions that exhibit red, green pixel portions that exhibit green, and blue pixel portions that exhibit blue, and the image signal generation unit generates the image signal such that the number of gradations of the small image is smaller than the number of gradations of the normal image.

\* \* \* \* \*